(12) United States Patent
Hung

(10) Patent No.: US 6,951,446 B2
(45) Date of Patent: Oct. 4, 2005

(54) FAN COVER HEAT DISSIPATION ASSEMBLY FOR A HOST COMPUTER CPU

(76) Inventor: Kuo-Chuan Hung, P.O. Box No. 6-57, Junghe, Taipei 235 (TW)

(*) Notice: Subject to any disclaimer, the term of this patent is extended or adjusted under 35 U.S.C. 154(b) by 60 days.

(21) Appl. No.: 10/745,549

(22) Filed: Dec. 29, 2003

(65) Prior Publication Data
US 2005/0141993 A1 Jun. 30, 2005

(51) Int. Cl.[7] .............................................. F03B 11/00
(52) U.S. Cl. ............................... 415/213.1; 415/214.1; 415/227; 361/395
(58) Field of Search .................... 415/213.1, 214.1, 415/220, 227; 361/695, 696, 697

(56) References Cited

U.S. PATENT DOCUMENTS 5,936,836 A * 8/1999 Scholder ..................... 361/695
6,462,948 B1 * 10/2002 Leija et al. .................. 361/697
6,587,343 B2 * 7/2003 Novotny et al. ............. 361/698
6,731,502 B1 * 5/2004 Hsu ............................ 361/695

* cited by examiner

Primary Examiner—Edward K. Look
Assistant Examiner—Dwayne J. White

(57) ABSTRACT

A fan cover assembly installed within a computer case of a host computer, thereby providing a heat dissipating effect of for a CPU (central processing unit). Configured for usage in a slim IU industrial server computer case, whereby the fan cover assembly is structured to comprise a fan cover body and fans installed therein. Wherein the fan cover body is constructed to include a wind tunnel cover configured at a front-end and a fan cover configured at a rear-end thereof. Width and height of the wind tunnel cover are established so as to correspond with width and height of the CPU with addition of heat dissipation fins configured atop thereof. Upon assembling the fan cover body, and tightly screwing down such onto a back panel of the computer case, the fans expel hot air outwards, thereby achieving effectiveness of high temperature (60° C. and above) heat dissipation.

4 Claims, 5 Drawing Sheets

FAN COVER HEAT DISSIPATION ASSEMBLY FOR A HOST COMPUTER CPU

BACKGROUND OF THE INVENTION (a) Field of the Invention

The present invention relates to a fan cover heat dissipation assembly for a host computer CPU, and more particularly to a fan cover heat dissipation assembly configured for usage in an IU slim industrial server computer case, thereby providing functionality to strengthen heat dissipation of the CPU when such reaches a high temperature (60° C. and above), and constructed to include structural components comprising a fan cover body and a fan.

(b) Description of the Prior Art

Accordingly, a CPU utilized by a conventional industrial server generally consumes high electric power, and thus hot air generated by the CPU is comparatively large. However, space reserved for heat dissipation within a computer case is limited. Because a conventional heat sink is utilized in computer cases of every kind, and therefore the heat sink is employed as a heat dissipation configuration in majority of computer cases. Consequently, when being employed as the heat dissipation configuration, although there are a great many different constructional configurations, nevertheless, majority can be reduced to that as depicted in FIG. 1, whereby heat sinks b are first configured on top of heat source bodies a, and total hot air generated by the heat source bodies a is transmitted upwards towards the heat sinks b atop thereof. Thereafter, fans c configured within the computer case blow off the hot air, and expel the hot air outwards through a heat dissipation hole d configured at a rear-end of the computer case or the fans c blow air directly towards the CPU thereby dissipating heat generated therefrom. Because of considerable quantities of heat from the heat sources a amassing within a short time on the heat sinks having limited heat dissipating area, and continuous accumulation thereof, augmented by differing air flow directions of air blown by the fans c, as well as being subject to impediments of various components within the computer case, therefore dispersing of all the hot air at one time is difficult. Hence, the heat dissipation of the heat sinks is time-consuming and slow-moving, and is unable to achieve functionality of high temperature heat dissipation. Thus, the conventional heat dissipation assembly as aforesaid is unideal. Accordingly, the inventor of the present invention underwent research and development to provide a heat dissipation assembly that improves upon aforementioned shortcomings. Whereby when the heat sinks are carrying out dissipation of heat, the hot air is first evenly dissipated towards heat dissipation fins configured atop the CPU. The hot air is amassed within a fan cover, and the fans within the fan cover expel the hot air outwards from the computer case by means of drawing in, drawing out and discharging, thereby achieving effectiveness of high temperature heat dissipation, and realizing continuous operation of the host computer without risk of crashing.

SUMMARY OF THE INVENTION

In light of aforementioned shortcomings of a conventional structure, the inventor of the present invention, having accumulated years of experience in related arts, attentively and circumspectively carried out extensive study and exploration to ultimately design a completely new fan cover heat dissipation assembly for a host computer CPU.

A primary objective of the present invention is to provide the fan cover heat dissipation assembly for a host computer CPU that realizes effectiveness of high temperature heat dissipation.

To achieve aforementioned objective, the fan cover heat dissipation assembly for a host computer CPU of the present invention comprises and is constructed to include a fan cover body and fans. Wherein the fan cover body comprises a wind tunnel cover configured at a front-end and a fan cover configured at a rear-end thereof. The fans are installed within the fan cover, and width and height of the wind tunnel cover are established so as to correspond with width and height of a CPU with addition of heat dissipation fins configured atop thereof. Upon mutual assemblage of the wind tunnel cover and the fan cover, such is tightly screwed down into screw holes defined in a back panel at a rear of a computer case thereof.

According to aforementioned structural configuration, the wind tunnel appropriately covers the heat dissipation fins configured atop the CPU. Hot air of the CPU is first evenly dissipated towards the heat dissipation fins atop the CPU, and the hot air of the heat dissipation fins is amassed within the fan cover, thereafter the fans configured at a rear-end within the fan cover expel the hot air outwards from the computer case by means of drawing in, drawing out and discharging of such, thereby achieving effectiveness of high temperature heat dissipation. Such a configuration thereby prevents turbulent flow from generating within the computer case, and affecting efficiency of heat dissipation therein, subsequently resulting in problems of system instability and crashing of computer thereof.

To enable a further understanding of the said objectives and the technological methods of the invention herein, the brief description of the drawings below is followed by the detailed description of the preferred embodiments.

DETAILED DESCRIPTION OF THE PREFERRED EMBODIMENTS

Figure 1:
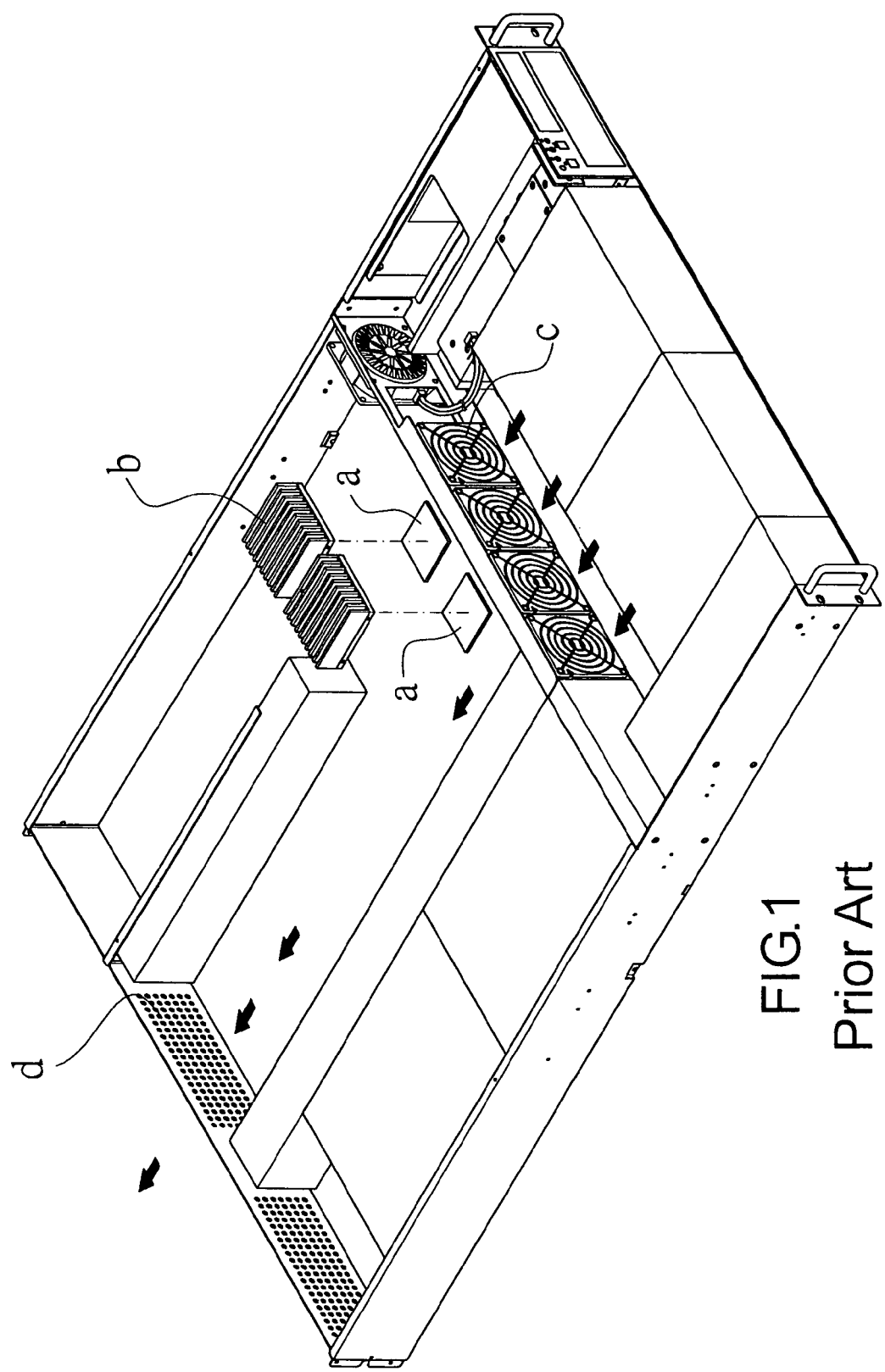
FIG. 1 shows an elevational view of a conventional industrial computer heat dissipation structure.
Figure 2:
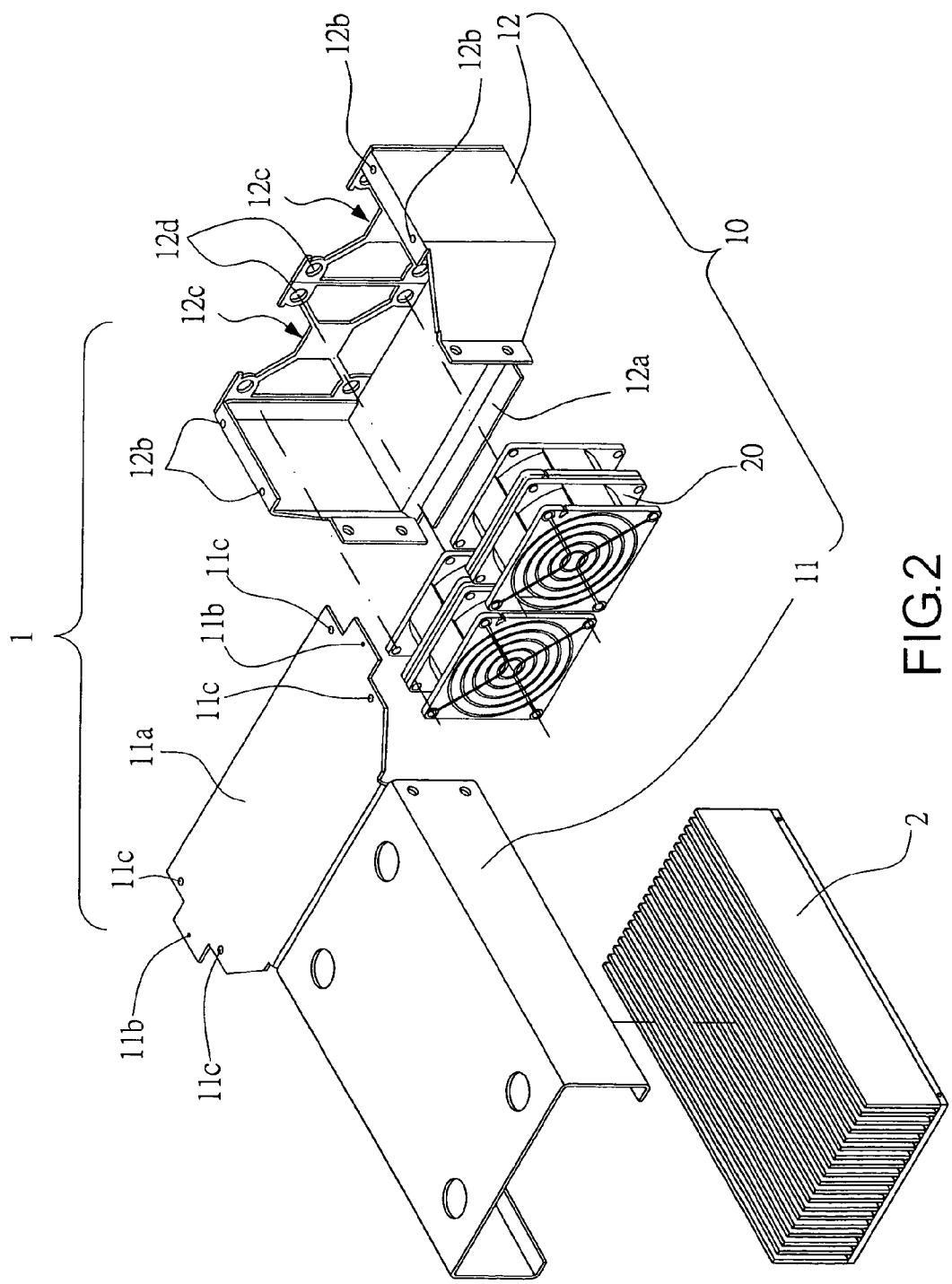
FIG. 2 shows an exploded elevational view of a fan cover according to the present invention.
Figure 3:
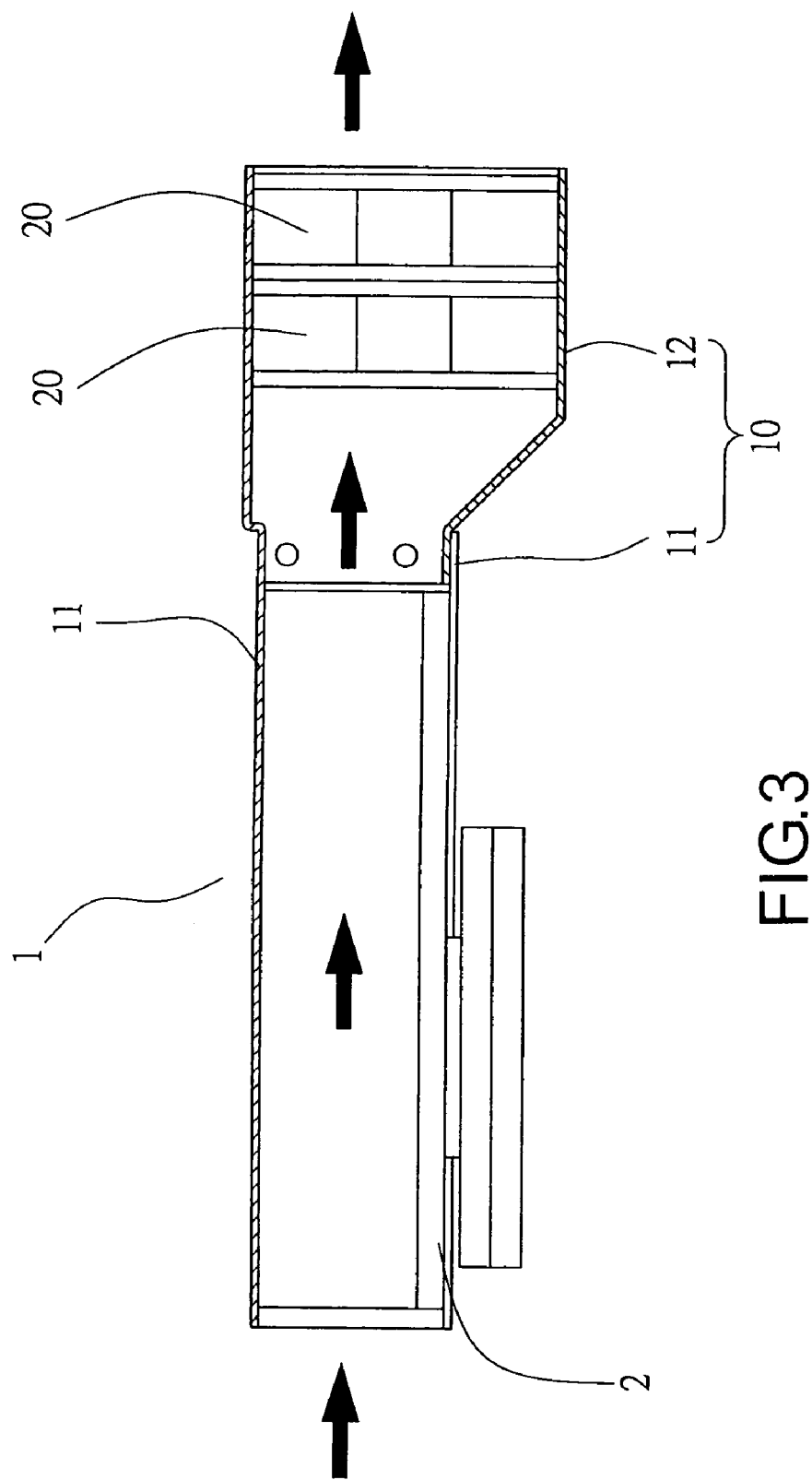
FIG. 3 shows a cross sectional view of the fan cover assembly and CPU assembled according to the present invention.
Figure 4:
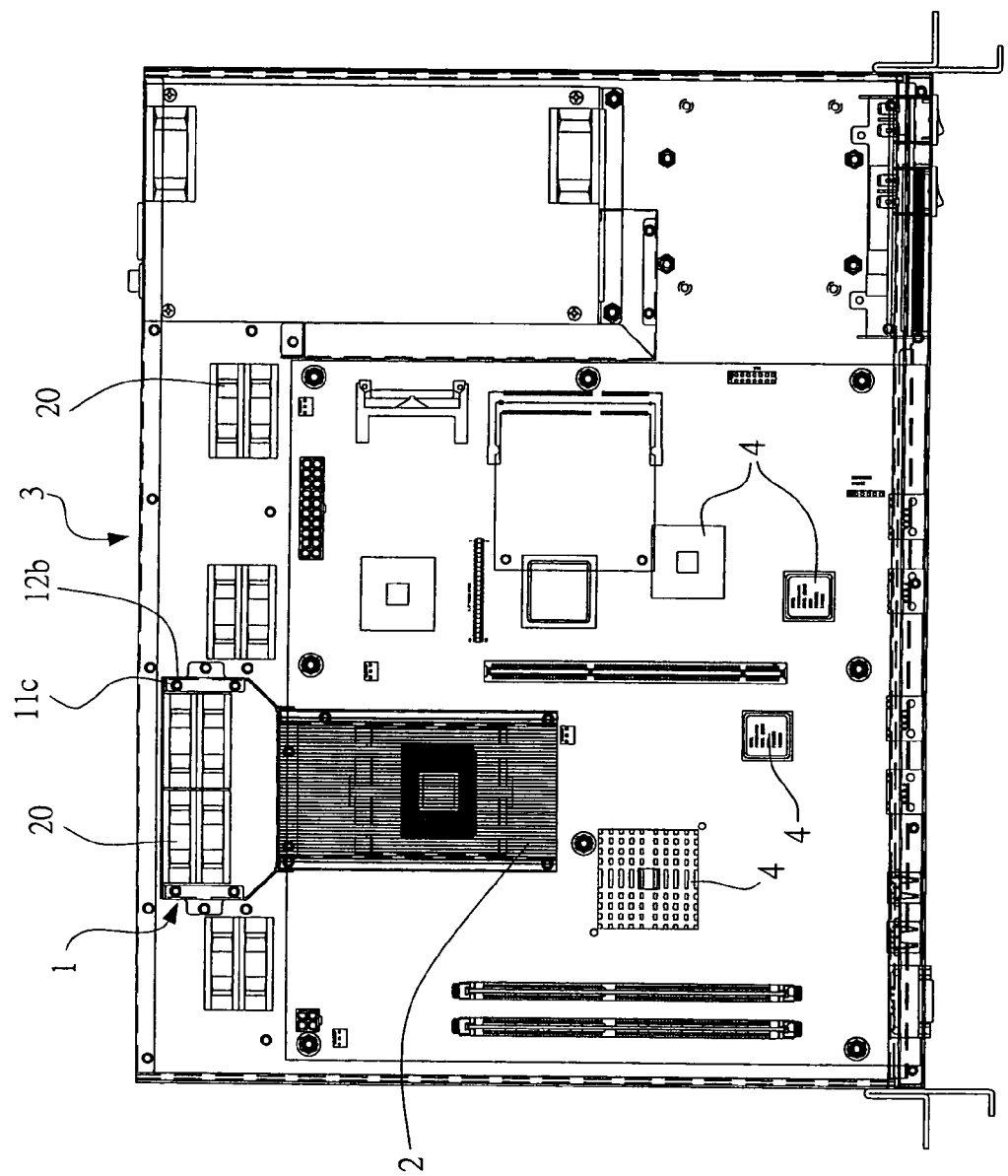
FIG. 4 shows a plan view of a fan cover heat dissipation assembly installed in a computer case according to the present invention.

A detailed description of structure, devices and characteristics of a practicable preferred embodiment of the present invention in accompaniment with drawings is disclosed hereinafter:

Referring to FIGS. 2, 3, and 4, which show a fan cover heat dissipation assembly for a host computer CPU of the present invention, primarily comprising and so structured to include a fan cover body 10 and two fans 20. Wherein:

The fan cover body 10 is constructed to include a wind tunnel cover 11 configured at a front-end and a fan cover 12 configured at a rear-end. Wherein a small section of a bottom edge of two perpendicular plates of the wind tunnel cover 11 are inwardly bent, thereby making width of an opening of a lower portion of the wind tunnel cover 11 slightly larger than that of heat dissipation fins 2. A rear-end of the wind tunnel cover 11 is provided with a backwardly extended fan top cover 11a. Left and right sides of the fan top cover 11a are provided with screw holes 11b to correspond with fastening means of a computer case 3, and a plurality of fastening holes 11c defined so as to correspond and align with similar atop the fan cover 12. A rear-end and left and right sides of the fan cover 12 are bent upwards so as to form an open sink. Moreover, plates of two sides and a bottom portion are frontally and inwardly bent to form a trumpet opening 12a thereof. The trumpet opening 12a and edges of an upper opening are provided with fastening holes 12b so as to correspond with the fastening holes 11c of the wind tunnel cover 11. Dimensions of the trumpet opening 12a are in accordance with shape of the rear-end of the wind tunnel cover 11. Ventilation holes 12c are defined in a back panel of the fan cover 11 (having circular shape or other irregular shapes), and screw holes 12d are utilized to fasten fans 20 therewith.

Regarding configuration of a plurality of the fans 20, firstly the two fans 20 are assembled in a superpositioned fashion, whereby the set of two fans 20 are installed interior to the back panel of the fan cover 12 in a juxtapositioned manner, and configured so as to vent outwards.

During assembly, the two fans 20 are first securely fastened interior to the back panel of the fan cover 12, and thereafter the fan cover 12 is aligned with the wind tunnel cover 11 so as corresponding fastening holes 11c and 12b coincide, and securely fastened down thereat. Thereupon, screws are utilized to securely fasten down the entire fan cover assembly 1 to an appropriate position within the computer case 3, thereby tightly joining the fan cover body 10 to the computer case 3, and realizing non-leakage of hot air within confines of the computer case 3.

Figure 5:
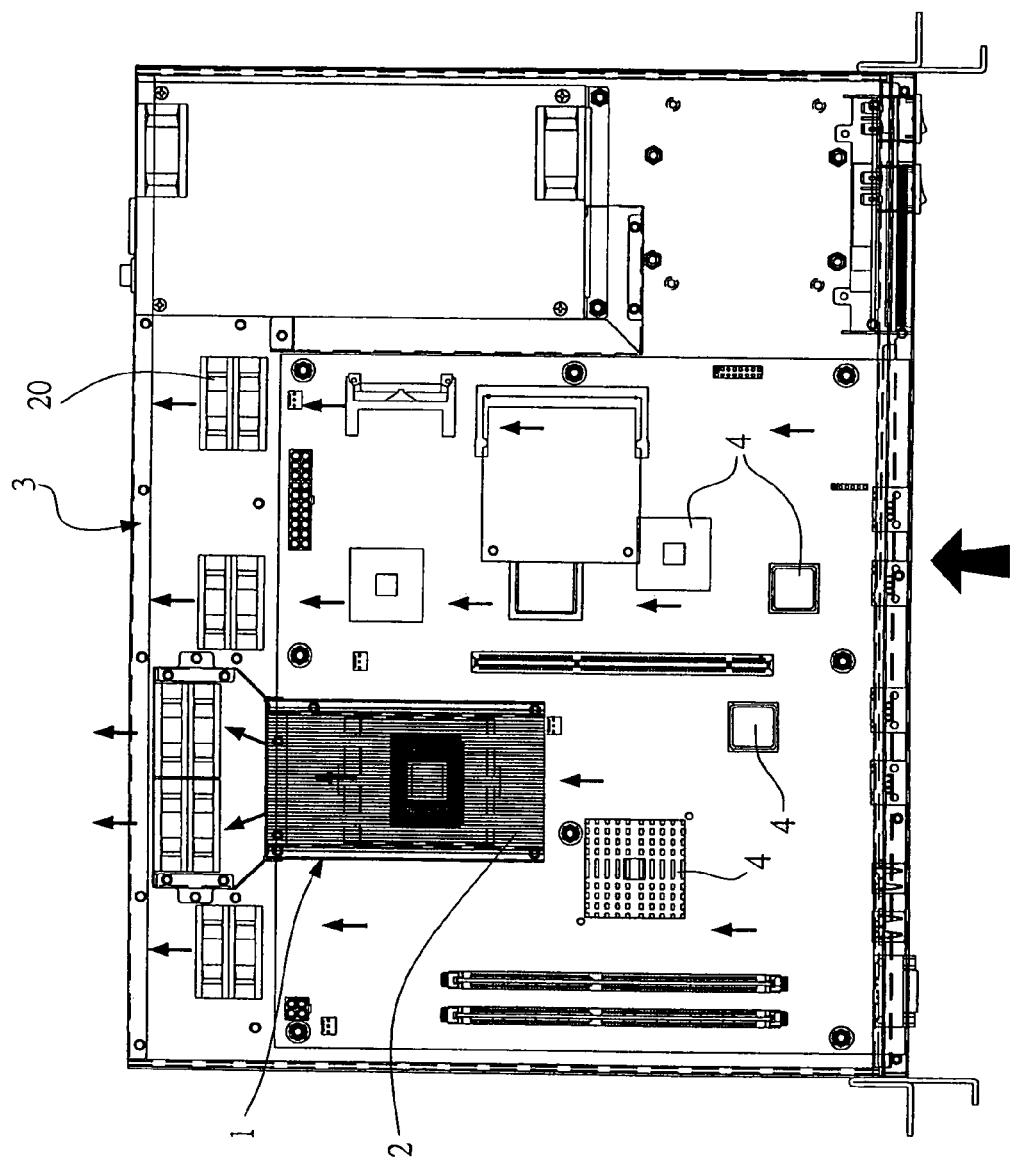
FIG. 5 shows a schematic plan view of air direction of an embodiment according to the present invention.

Referring to FIG. 5, which shows a schematic view of air direction of the embodiment of the present invention. The fan cover assembly 1 is installed at an appropriate position at a rear-end of a slim IU industrial server host computer case, and a plurality of the fans 20 are configured on two sides of the fan cover assembly 1 so as to vent outwards. An inwardly directed airflow is produced by a heat dissipation hole configured at a front-end of the computer case 3, and the fan cover assembly 1 and the fans 20 configured on the two sides thereof work collectively to carry and expel outwards the hot air generated by electronic components within the computer case 3 by means of the direction of the airflow. Such a configuration thereby prevents turbulent flow from generating within the computer case 3 and affecting efficiency of heat dissipation therein.

In conclusion, the fan cover heat dissipation assembly for a host computer CPU of the present invention assuredly achieves effectiveness of high temperature heat dissipation, and moreover is a new invention having practicability and advancement. It is of course to be understood that the embodiments described herein is merely illustrative of the principles of the invention and that a wide variety of modifications thereto may be effected by persons skilled in the art without departing from the spirit and scope of the invention as set forth in the following claims.

What is claimed is:

1. A fan cover heat dissipation assembly for a host computer CPU, whereby the fan cover assembly is primarily constructed to comprise a fan cover body and fans; and characterized in that: the fan cover body comprises a wind tunnel cover configured at a front-end and a fan cover configured at a rear-end thereof, wherein width of an opening of a lower portion of the wind tunnel cover is slightly larger than width of heat dissipation fins; a rear-end of the wind tunnel cover is provided with a backwardly extended fan top cover, and a rear-end and left and right sides of the fan cover are bent upwards so as to form an open sink, and is further defined to provide a trumpet opening; whereby dimensions of the trumpet opening are in accordance with shape of the rear-end of the wind tunnel cover; ventilation holes are defined in a back panel of the fan cover.

2. The fan cover heat dissipation assembly for a host computer CPU according to claim 1, wherein the ventilation holes are a plurality of circular apertures.

3. The fan cover heat dissipation assembly for a host computer CPU according to claim 1, wherein the ventilation holes are a plurality of irregular shaped apertures.

4. The fan cover heat dissipation assembly for a host computer CPU according to claim 1, wherein the fans are assembled in a superpositioned fashion, whereby a set of two fans are arranged in a juxtapositioned manner, and installed interior to a back panel of the fan cover, and configured so as to vent outwards therefrom.

\* \* \* \* \*